US008828847B2

(12) United States Patent
Endo

(10) Patent No.: US 8,828,847 B2
(45) Date of Patent: Sep. 9, 2014

(54) LASER BEAM PROCESSING METHOD FOR A WAFER

(75) Inventor: Tomohiro Endo, Ota-Ku (JP)

(73) Assignee: Disco Corporation, Tokyo (JP)

( * ) Notice: Subject to any disclaimer, the term of this patent is extended or adjusted under 35 U.S.C. 154(b) by 185 days.

(21) Appl. No.: 13/483,957

(22) Filed: May 30, 2012

(65) Prior Publication Data

US 2012/0309168 A1    Dec. 6, 2012

(30) Foreign Application Priority Data

Jun. 1, 2011  (JP) .................................. 2011-123533

(51) Int. Cl.
*H01L 21/78* (2006.01)
*H01L 21/46* (2006.01)

(52) U.S. Cl.
CPC ....................................... *H01L 21/78* (2013.01)
USPC ................................. 438/462; 257/E21.599

(58) Field of Classification Search
USPC .................................. 438/462; 257/E21.599
See application file for complete search history.

(56) References Cited

U.S. PATENT DOCUMENTS

| 7,005,317 | B2* | 2/2006 | Chin et al. ..................... 438/106 |
| 7,544,588 | B2* | 6/2009 | Genda ............................ 438/462 |
| 8,211,781 | B2* | 7/2012 | Saito et al. .................... 438/458 |
| 2007/0023691 | A1 | 2/2007 | Morishige et al. |
| 2007/0293021 | A1 | 12/2007 | Yoshikawa |
| 2009/0197351 | A1* | 8/2009 | Morikazu ......................... 438/5 |
| 2010/0317172 | A1 | 12/2010 | Morikazu |
| 2011/0104835 | A1 | 5/2011 | Nihei et al. |

FOREIGN PATENT DOCUMENTS

JP        10-305420        11/1998

* cited by examiner

*Primary Examiner* — Luan C Thai
(74) *Attorney, Agent, or Firm* — Greer Burns & Crain Ltd.

(57) ABSTRACT

A processing method for a wafer which has, on a surface thereof, a device region in which a plurality of devices are formed and partitioned by division lines and an outer periphery excess region surrounding the device region, includes a dividing groove formation step of irradiating a laser beam of a wavelength having absorbability by a wafer along the division lines to form dividing grooves serving as start points of cutting, and a dividing step of applying external force to the wafer on which the dividing grooves are formed to cut the wafer into the individual devices. At the dividing groove formation step, the dividing grooves are formed along the division lines in the device region while a non-processed region is left in the outer periphery excess region on extension lines of the division lines.

2 Claims, 7 Drawing Sheets

LASER BEAM PROCESSING METHOD FOR A WAFER

BACKGROUND OF THE INVENTION

1. Field of the Invention

This invention relates to a laser beam processing method for a wafer for processing a wafer such as a semiconductor wafer or an optical device wafer using a laser beam.

2. Description of the Related Art

A wafer such as a silicon wafer or a sapphire wafer which has a plurality of devices such as ICs, LSIs, LEDs or the like formed on the surface thereof such that the devices are partitioned by division lines is divided into individual devices by a processing apparatus, and the divided devices are utilized widely in various electric apparatus such as portable telephone sets or personal computers. For the dividing of a wafer, a dicing method in which a cutting device called dicer is used is adopted widely. In the dicing method, a cutting blade of approximately 30 µm thick formed by binding abrasive grain of diamond or the like with metal or resin is rotated at a speed as high as approximately 30,000 rpm to cut into a wafer to cut the wafer into individual devices.

Meanwhile, in recent years, a method has been proposed wherein a pulse laser beam of a wavelength having absorbability by a wafer is irradiated upon a wafer to form laser processed grooves (dividing grooves) and then external force is applied using a breaking apparatus along the laser processed grooves to cut the wafer into individual devices (refer to, for example, Japanese Patent Laid-Open No. Hei 10-305420). Formation of laser processed grooves by a laser processing apparatus can raise the processing speed in comparison with a dicing method by a dicer and can process even a wafer made of a material of high hardness such as sapphire or SiC comparatively easily. Further, since the width of processing grooves can be set to a small width of, for example, less than 10 µm, the number of devices to be taken per one wafer can be increased in comparison with an alternative case wherein a dicing method is used for processing.

In processing of a wafer by a laser processing apparatus, a wafer is adhered to a dicing tape adhered at an outer peripheral portion thereof to an annular frame such that the wafer is supported on the annular frame through the dicing tape. Then, a laser beam is irradiated in a state in which the wafer is sucked to and held by a chuck table of the laser processing apparatus through the dicing tape.

SUMMARY OF THE INVENTION

However, there is a problem that, where the diameter of a wafer such as an optical device wafer wherein an epitaxial layer is laminated on a crystal growth substrate such as a sapphire substrate is as great as approximately 150 mm, if a dividing groove (laser processed groove) which serves as a start point for dividing is formed on a division line, then when the wafer on which dividing grooves are formed is carried out from the laser processing apparatus or when the wafer is transported to a dividing apparatus, the wafer is guided not along a dividing groove but in a crystal orientation and is broken owing to the wafer's own weight, magnitude of the moment due to the large wafer, or the like.

Therefore, it is an object of the present invention to provide a laser processing method for a wafer wherein, when a wafer of a large diameter is carried out from a laser processing apparatus or is transported to a dividing apparatus after laser processed grooves are formed on the wafer, breaking of the wafer can be prevented.

In accordance with an aspect of the present invention, there is provided a processing method for a wafer which has, on a surface thereof, a device region in which a plurality of devices are formed and partitioned by division lines and an outer periphery excess region surrounding the device region, including a dividing groove formation step of irradiating a laser beam of a wavelength having absorbability by a wafer along the division lines to form dividing grooves serving as start points of cutting, and a dividing step of applying external force to the wafer on which the dividing grooves are formed to cut the wafer into the individual devices, said dividing groove formation step forming the dividing grooves along the division lines in the device region while a non-processed region is being left in the outer periphery excess region on extension lines of the division lines.

In accordance with another aspect of the present invention, there is provided a processing method for a wafer which has, on a surface thereof, a device region in which a plurality of devices are formed and partitioned by division lines and an outer periphery excess region surrounding the device region, including a dividing groove formation step of irradiating a laser beam of a wavelength having absorbability by a wafer to form dividing grooves serving as start points of cutting, and a dividing step of applying external force to the wafer on which the dividing grooves are formed to cut the wafer into the individual devices, said dividing groove formation step including a first dividing groove formation step of irradiating a laser beam of first power, which is comparatively high, along the division lines in the device region to form first dividing grooves, and a second dividing groove formation step of irradiating another laser beam of second power, which is lower than the first power, in the outer periphery excess region on extension lines of the division lines in the device region to form second dividing grooves.

At the dividing groove formation step in the wafer processing method of the present invention, a laser beam is irradiated along the division lines in the device region to form dividing grooves which serve as start points of dividing. However, in the outer periphery excess region on extension lines of the division lines, no laser beam is irradiated or another laser beam having comparatively low power is irradiated. Therefore, the outer periphery excess region can be kept with suitable strength. Accordingly, even if dividing grooves (laser processed grooves) serving as start points of cutting are formed on the division lines of a wafer of such a large diameter as approximately 150 mm, when the wafer is carried out from the laser processing apparatus or when the wafer is transported to a dividing apparatus, breaking of the wafer can be prevented.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
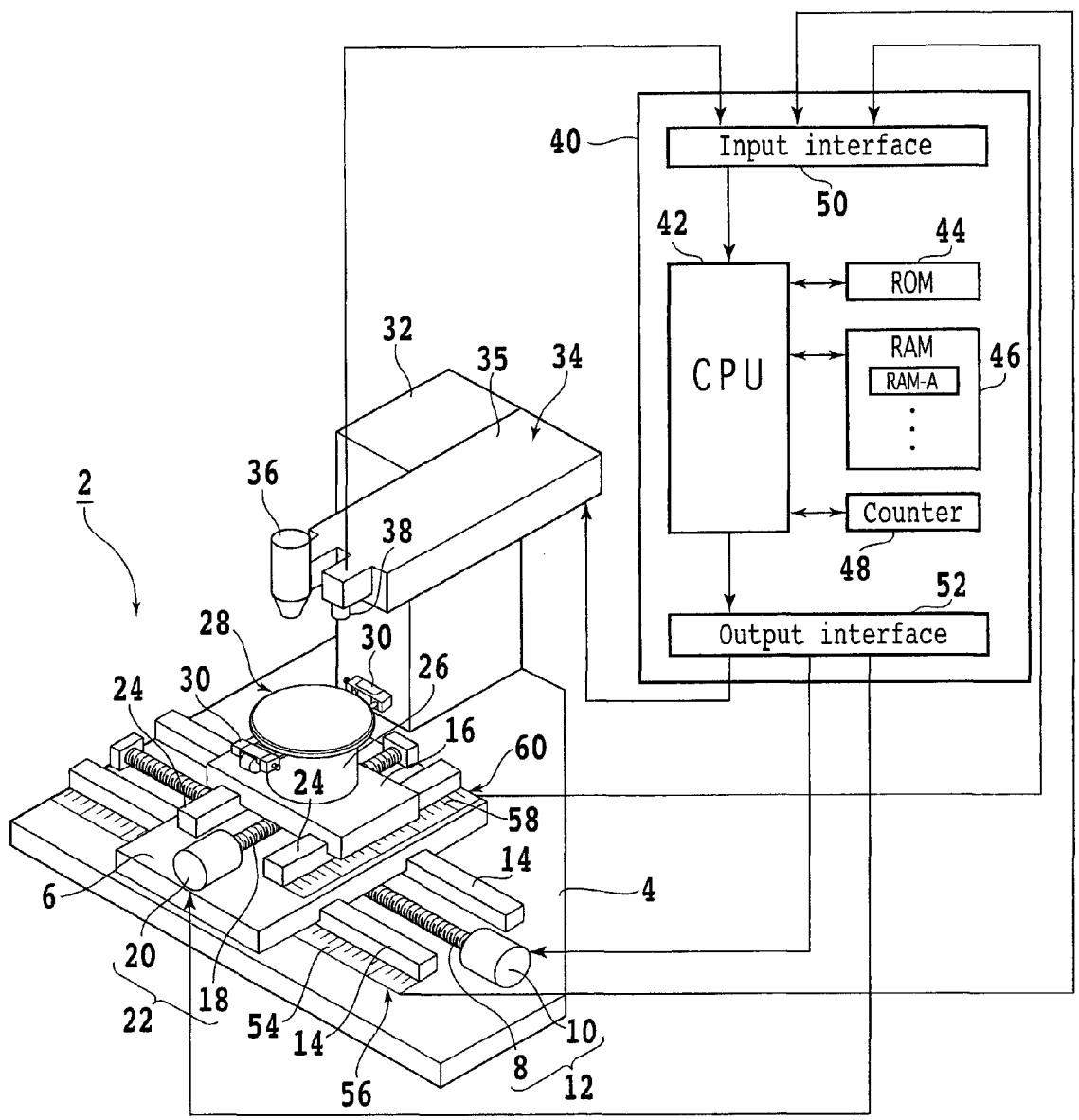
FIG. 1 is a perspective view of a laser processing apparatus suitable to carry out a processing method for a wafer according to the present invention.

In the following, embodiments of the present invention are described in detail with reference to the drawings. Referring to FIG. 1, there is shown a general configuration of a laser processing apparatus 2 suitable to carry out a processing method for a wafer according to the present invention. The laser processing apparatus 2 includes a first slide block 6 mounted for movement in an X-axis direction on a stationary base 4. The first slide block 6 is moved in a work feeding direction, that is, in the X-axis direction, along a pair of guide rails 14 by work feeding means 12 configured from a ball screw 8 and a stepping motor 10.

A second slide block 16 is mounted for movement in a Y-axis direction on the first slide block 6. In particular, the second slide block 16 is moved in an indexing feeding direction, that is, in the Y-axis direction, along a pair of guide rails 24 by indexing feeding means 22 configured from a ball screw 18 and a stepping motor 20. A chuck table 28 is mounted on the second slide block 16 with a cylindrical supporting member 26 interposed therebetween, and the chuck table 28 is movable in the X-axis direction and the Y-axis direction by the work feeding means 12 and the indexing feeding means 22, respectively. The chuck table 28 has a clamp 30 provided thereon for clamping a wafer sucked to and held on the chuck table 28.

Figure 2:
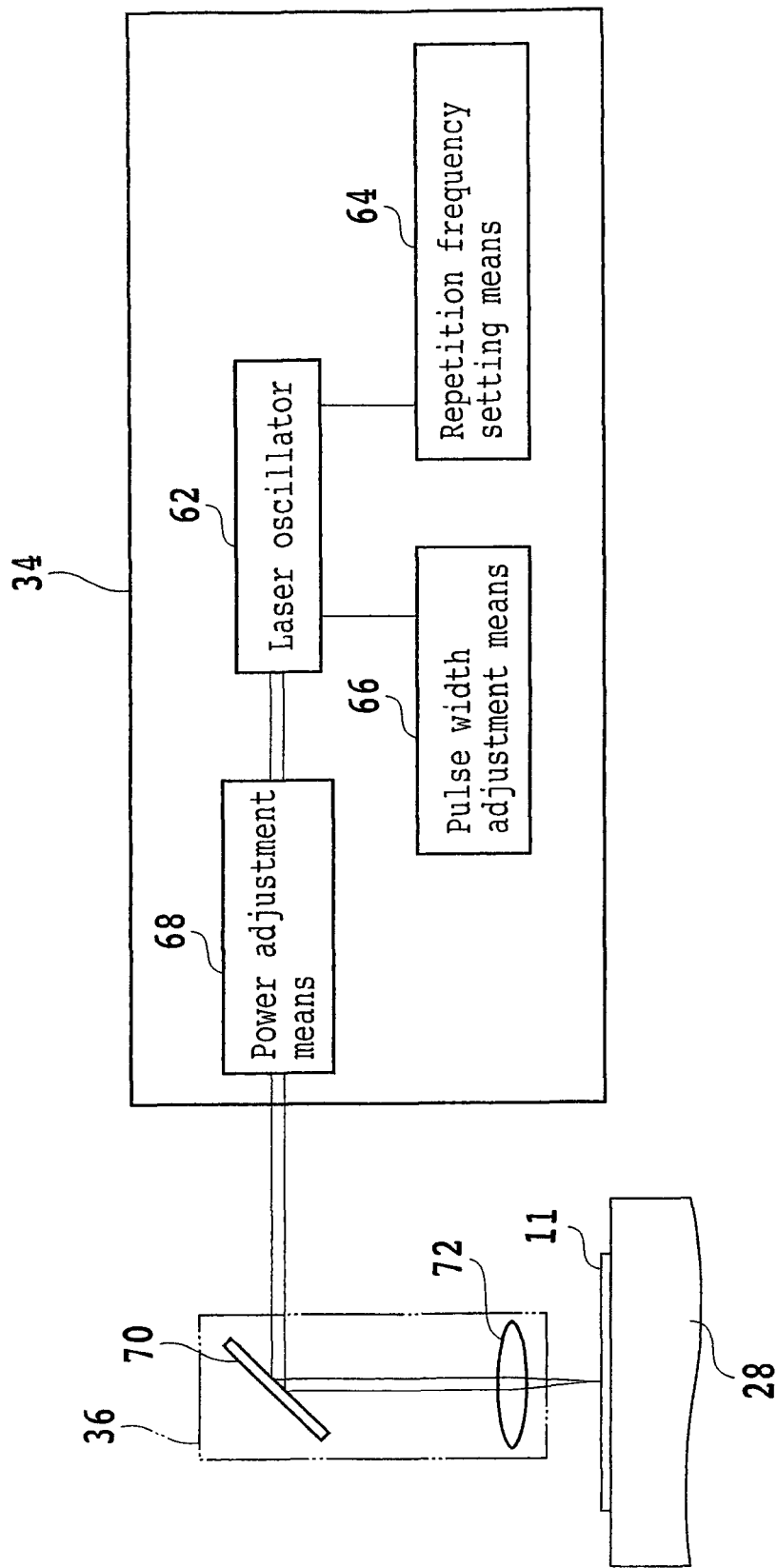
FIG. 2 is a block diagram of a laser beam irradiation unit.

A column 32 is provided uprightly on the stationary base 4 and has a casing 35 attached thereto for accommodating a laser beam irradiation unit 34. As seen in FIG. 2, the laser beam irradiation unit 34 includes a laser oscillator 62 for oscillating a YAG laser or a YVO4 laser, repetition frequency setting means 64, pulse width adjustment means 66, and power adjustment means 68. A pulse laser beam adjusted to predetermined power by the power adjustment means 68 of the laser beam irradiation unit 34 is reflected by a mirror 70 of a condenser 36 attached to an end of the casing 35 and then condensed by a condensing object lens 72, whereafter it is irradiated upon an optical device wafer 11 held on the chuck table 28.

At an end portion of the casing 35, image pickup means 38 for detecting a processing region to be subjected to laser processing is disposed in alignment with the condenser 36 in the X-axis direction. The image pickup means 38 includes an image pickup element such as an ordinary CCD element for picking up an image of the processing region of the semiconductor wafer using visible rays of light. The image pickup means 38 further includes infrared ray irradiation means for irradiating infrared rays upon the semiconductor wafer, an optical system for capturing the infrared rays irradiated by the infrared ray irradiation means, and infrared ray image pickup means configured from an infrared ray image pickup element such as an infrared ray CCD unit for outputting an electric signal corresponding to the infrared rays captured by the optical system. An image signal of the picked up image is transmitted to a controller or control means 40.

The controller 40 is configured from a computer and includes a central processing unit (CPU) 42 for carrying out arithmetic operation processing in accordance with a control program, a read only memory (ROM) 44 for storing the control program and so forth, a readable and writable random access memory (RAM) 46 for storing an arithmetic operation result and so forth, a counter 48, an input interface 50, and an output interface 52.

Work feeding amount detection means 56 is configured from a linear scale 54 disposed along the guide rails 14 and a reading head not shown disposed on the first slide block 6. A detection signal of the work feeding amount detection means 56 is inputted to the input interface 50 of the controller 40. Indexing feeding amount detection means 60 is configured from a linear scale 58 disposed along the guide rails 24 and a reading head not shown disposed on the second slide block 16. A detection signal of the indexing feeding amount detection means 60 is inputted to the input interface 50 of the controller 40. Also an image signal picked up by the image pickup means 38 is inputted to the input interface 50 of the controller 40. Meanwhile, a control signal is outputted from the output interface 52 of the controller 40 to the stepping motor 10, stepping motor 20, laser beam irradiation unit 34 and so forth.

Figure 3:
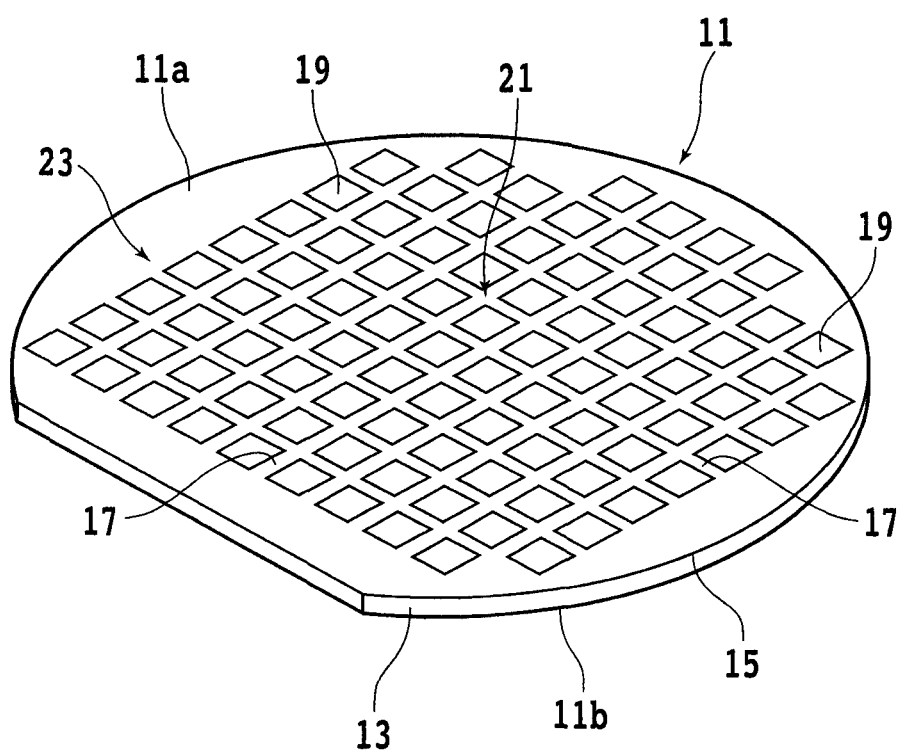
FIG. 3 is a perspective view of the front face side of an optical device wafer.

Referring to FIG. 3, there is shown a perspective view of the front surface side of an optical device wafer 11 which is a processing object of the processing method of the present invention. The optical device wafer 11 is configured from a sapphire substrate 13 on which an epitaxial layer (semiconductor layer) 15 of gallium nitride (GaN) or the like is stacked. The optical device wafer 11 has a front face 11a on which the epitaxial layer 15 is stacked, and a rear face 11b to which the sapphire substrate 13 is exposed. The sapphire substrate 13 has a thickness of, for example, 100 μm while the epitaxial layer 15 has a thickness of, for example, 5 μm. A plurality of optical devices 19 such as LEDs are formed on the epitaxial layer 15 while they are partitioned by division lines (streets) 17 formed in a lattice shape. The optical device wafer 11 has, on the front surface thereof, a device region 21 in which the optical devices 19 are formed, and an outer periphery excess region 23 surrounding the device region 21.

Figure 4:
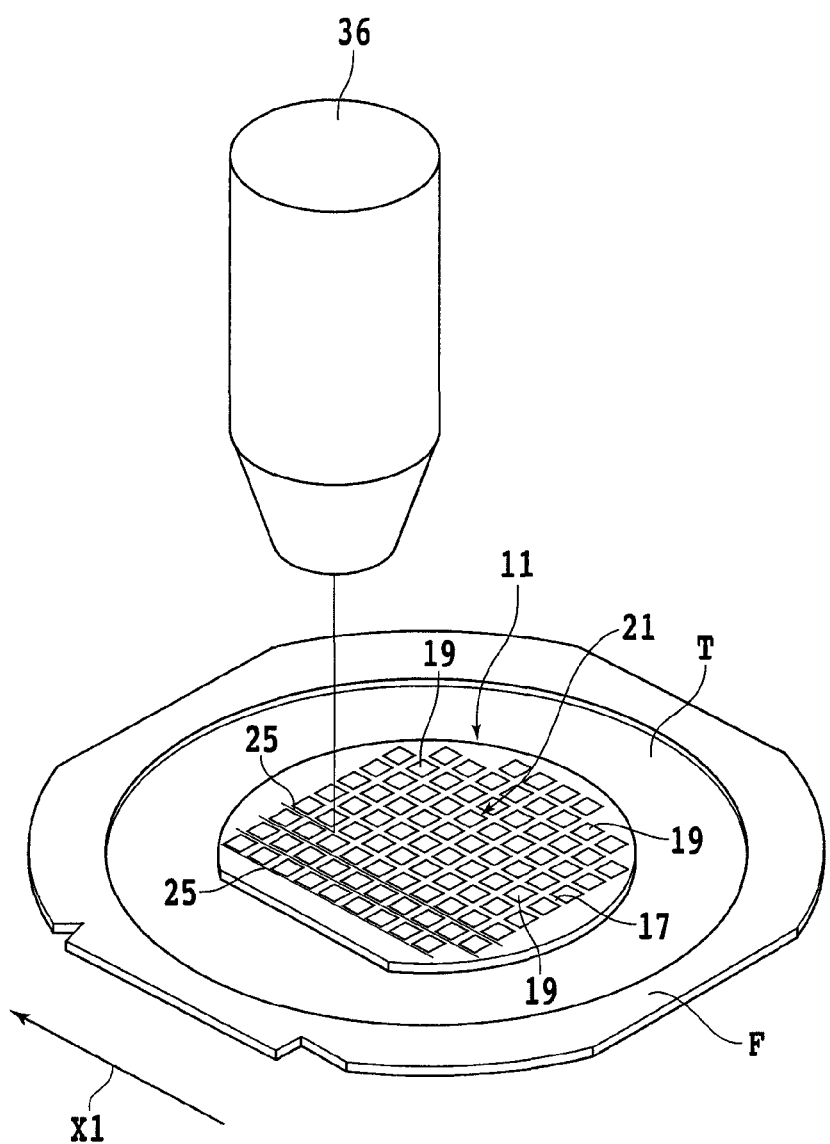
FIG. 4 is a perspective view illustrating a dividing groove formation step in a first embodiment.

In order to carry out laser processing to the optical device wafer 11, it is adhered at the rear face 11b thereof to a dicing tape T, which is an adhesive tape, and the dicing tape T is adhered at an outer peripheral portion thereof to an annular frame F as shown in FIG. 4. Consequently, the optical device wafer 11 is placed in a state in which it is supported on the annular frame F through the dicing tape T. Then, upon laser processing, the optical device wafer 11 is sucked to and held by the chuck table 28 with the dicing tape T interposed therebetween and the annular frame F is clamped and secured by the clamp 30.

In the processing method for a wafer of the present invention, an image of a processing region of the optical device wafer 11 is picked up by the image pickup means 38 to carry out an image process such as pattern matching for positioning the condenser 36 of the laser beam irradiation unit 34 for irradiating a laser beam and a street 17 extending in the first direction relative to each other thereby to carry out alignment of a laser beam irradiation position. Then, the chuck table 28 is rotated by 90 degrees to carry out alignment between a street 17 extending in the second direction perpendicular to the first direction and the condenser 36.

After the alignment step is carried out, a pulse laser beam having absorbability by the optical device wafer 11 is irradiated upon a division line 17 in the device region 21 of the optical device wafer 11 as shown in FIG. 4, and the chuck table 28 is moved at a predetermined work feeding speed in a direction indicated by an arrow mark X1 to form a dividing groove (laser processed groove) 25 along the division line 17 in the device region 21 which extends in the first direction.

Figure 5:
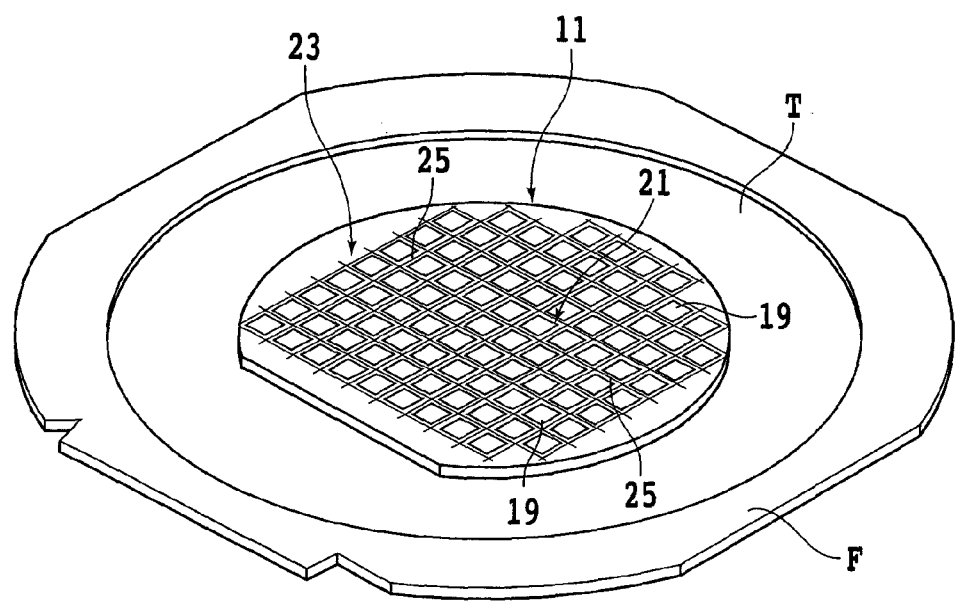
FIG. 5 is a perspective view of a wafer after an end of the dividing groove formation step in the first embodiment.

While the chuck table 28 is index-fed, a similar dividing groove 25 is formed along all division lines 17 in the device region 21 which extend in the first direction. Then, the chuck table 28 is rotated by 90 degrees, and then a similar pulse laser beam is irradiated along all of the division lines 17 in the device region 21 which extend in the second direction to form dividing grooves 25. Referring to FIG. 5, there is shown a perspective view of the optical device wafer 11 in a state in which a dividing groove 25 is formed along all of the division lines 17 in the device region 21.

Figure 6:
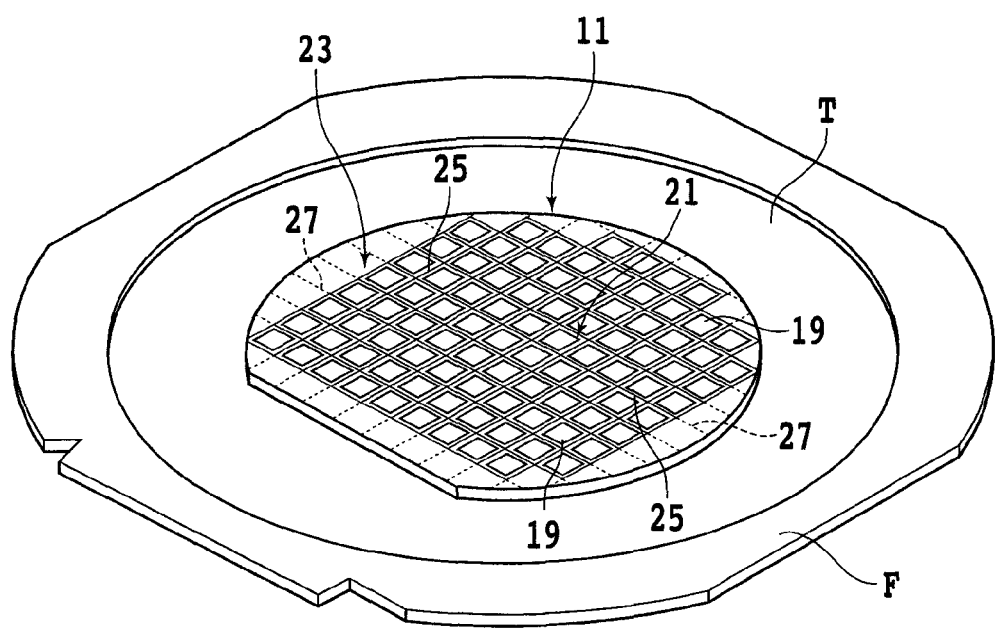
FIG. 6 is a perspective view of the wafer after an end of the dividing groove formation step in a second embodiment.

At the dividing groove formation step in the second embodiment of the present invention, a laser beam of first power which is comparative high is irradiated upon the division lines 17 in the device region 21 to form first dividing grooves 25 as seen in FIG. 6. Then, in the outer periphery excess region 23 on extension lines of the division lines 17, a laser beam of second power which is lower than the first power is irradiated to form second dividing grooves 27. FIG. 6 shows a perspective view in a state in which a first dividing groove 25 is formed along all division lines 17 in the device region 21 while second dividing grooves 27 continuing to the first dividing grooves 25 are formed in the outer periphery excess region 23. The dividing groove formation step in the second embodiment particularly is, for example, such as follows.

Working Example 1

Laser processing was carried out in the following laser processing conditions for an optical device wafer having a diameter of 150 mm and a thickness of 100 μm.
(a) First dividing groove formation conditions
  Light source: YAG pulse laser
  Wavelength: 355 nm (third harmonic generation of the YAG laser)
  Average output power: 1.5 W
  Processing depth: 30 μm
  Repetition frequency: 100 kHz
  Spot diameter: 5 μm
  Feeding speed: 150 mm/s
(b) Second dividing groove formation conditions
  Light source: YAG pulse laser
  Wavelength: 355 nm (third harmonic generation of the YAG laser)
  Average output power: 0.5 W
  Processing depth: 10 μm
  Repetition frequency: 100 kHz
  Spot diameter: 5 μm
  Feeding speed: 150 mm/s Working Example 2

Figure 7:
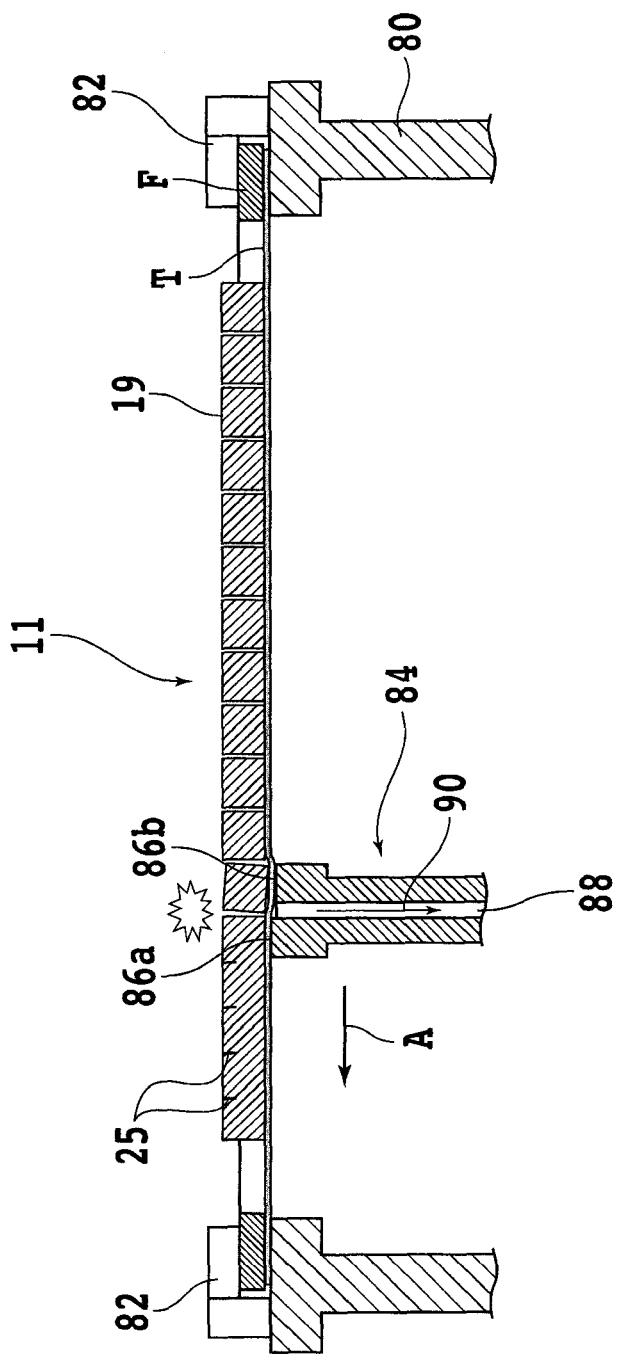
FIG. 7 is a sectional view illustrating a dividing step.

Laser processing was carried out in the following laser processing conditions for an optical device wafer having the same conditions as those in the processing example 1.
(a) First dividing groove formation conditions
  Light source: YAG pulse laser
  Wavelength: 355 nm (third harmonic generation of the YAG laser)
  Average output power: 1.5 W
  Processing depth: 30 μm
  Repetition frequency: 100 kHz
  Spot diameter: 5 μm
  Feeding speed: 150 mm/s
(b) Second dividing groove formation conditions
  Light source: YAG pulse laser
  Wavelength: 355 nm (third harmonic generation of the YAG laser)
  Average output power: 1.5 W
  Processing depth: 10 μm
  Repetition frequency: 100 kHz
  Spot diameter: 5 μm
  Feeding speed: 350 mm/s After the dividing groove formation step in the first embodiment is carried out, the annular frame F which supports the optical device wafer 11 with the dicing tape T interposed therebetween is placed on the receiving face of a cylinder 80 as seen in FIG. 7, and the annular frame F is clamped by a clamp 82. Then, a dividing jig 84 in the form of a bar is disposed into the cylinder 80. The dividing jig 84 has an upper stage holding face 86a and a lower stage holding face 86b, and has a vacuum suction path 88 formed therein such that it is open to the lower stage holding face 86b. A detailed structure of the dividing jig 84 is disclosed in Japanese Patent No. 4361506 and incorporated herein as a reference.

In order to carry out a dividing process by the dividing jig 84, while the vacuum suction path 88 of the dividing jig 84 is sucked and held as indicated by an arrow mark 90, the upper stage holding face 86a and the lower stage holding face 86b of the dividing jig 84 are brought into contact with the dicing tape T from below and the dividing jig 84 is moved in the direction indicated by an arrow mark A. In other words, the dividing jig 84 is moved in a direction perpendicular to a division line 17 of a target of slitting. Consequently, if the dividing groove 25 is moved to a position just above an inner side edge of the upper stage holding face 86a of the dividing jig 84, then bending stress is generated in a concentrated manner at the location of the division line 17 having the dividing groove 25, and the optical device wafer 11 is cut along the division line 17 by the bending stress.

Although the outer periphery excess region 23 on the extension line of the division line 17 in the device region 21 is a non-processed region which does not have a dividing groove, since the width of the outer periphery excess region 23 formed at the opposite end portions of the device region 21 is comparatively small, also the outer periphery excess region 23 is cut substantially along an extension line of the division line 17 simultaneously when the division line 17 in the device region 21 is cut. It is to be noted that the direction of the cutting of the outer periphery excess region 23 is not significant because the optical devices 19 are not formed in the outer periphery excess region 23.

While the dividing jig 84 is moved in the direction of the arrow mark A, the optical device wafer 11 is cut along all of the division lines 17 extending in the first direction. Then, the dividing jig 84 is rotated by 90 degrees, or the cylinder 80 is rotated by 90 degrees, and the optical device wafer 11 is cut similarly along the division lines 17 extending in the second direction perpendicular to the division lines 17 extending in the first direction.

At the dividing groove formation step in the second embodiment, the first dividing grooves 25 are formed with a processing depth of 30 μm in the device region 21, and the second dividing grooves 27 of another processing depth of 10 μm are formed in the outer periphery excess region 23. Although the processing depth of the second dividing grooves 27 is 10 μm and is smaller than the processing depth of 30 μm of the first dividing grooves 25, if a first dividing groove 25 or a second dividing groove 27 moves to a position just above an inner side edge of the upper stage holding face 86a of the dividing jig 84, then bending stress is generated in a concentrated manner at the location of the division line 17 which has the first dividing groove 25 and the location in the outer periphery excess region 23 on the extension line of the division line 17. Thus, the optical device wafer 11 can be cut along the division line 17 and the extension line of the division line 17 by the bending stress.

While, in the embodiments described above, the processing method of the present invention is applied to the optical device wafer 11, the application of the processing method of the present invention is not limited to the optical device wafer 11 but the processing method of the present invention can be applied similarly also to an ordinary semiconductor wafer formed from silicon, a compound semiconductor wafer and so forth. While, in the embodiments described above, the dividing groove formation step is carried out by irradiating a laser beam from the front face 11a side of the optical device wafer 11, a laser beam may otherwise be irradiated from the rear face 11b side of the optical device wafer 11 to carry out the dividing groove formation step.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing method for a wafer which has, on a surface thereof, a device region in which a plurality of devices are formed and partitioned by division lines and an outer periphery excess region surrounding the device region, comprising:
    a dividing groove formation step of irradiating a laser beam of a wavelength having absorbability by a wafer along the division lines to form dividing grooves serving as start points of cutting; and
    a dividing step of applying external force to the wafer on which the dividing grooves are formed to cut the wafer into the individual devices;
    said dividing groove formation step forming the dividing grooves along the division lines in the device region while a non-processed region is being left in the outer periphery excess region on extension lines of the division lines.

2. A processing method for a wafer which has, on a surface thereof, a device region in which a plurality of devices are formed and partitioned by division lines and an outer periphery excess region surrounding the device region, comprising:
    a dividing groove formation step of irradiating a laser beam of a wavelength having absorbability by a wafer along the division lines to form dividing grooves serving as start points of cutting; and
    a dividing step of applying external force to the wafer on which the dividing grooves are formed to cut the wafer into the individual devices;
    said dividing groove formation step including:
    a first dividing groove formation step of irradiating a laser beam of first power, which is comparatively high, along the division lines in the device region to form first dividing grooves; and
    a second dividing groove formation step of irradiating another laser beam of second power, which is lower than the first power, in the outer periphery excess region on extension lines of the division lines in the device region to form second dividing grooves.

* * * * *